(12) United States Patent
Mitchell

(10) Patent No.: US 9,383,561 B1
(45) Date of Patent: Jul. 5, 2016

(54) COMPACT ANNULAR FIELD IMAGER AND METHOD FOR IMAGING ELECTROMAGNETIC RADIATION

(71) Applicant: Thomas A. Mitchell, Nazareth, PA (US)

(72) Inventor: Thomas A. Mitchell, Nazareth, PA (US)

(73) Assignee: Wavefront Research, Inc., Bethlehem, PA (US)

( * ) Notice: Subject to any disclaimer, the term of this patent is extended or adjusted under 35 U.S.C. 154(b) by 305 days.

(21) Appl. No.: 14/212,917

(22) Filed: Mar. 14, 2014

Related U.S. Application Data

(60) Provisional application No. 61/783,507, filed on Mar. 14, 2013.

(51) Int. Cl.
*G02B 17/08* (2006.01)
*H01L 27/146* (2006.01)

(52) U.S. Cl.
CPC .......... *G02B 17/08* (2013.01); *H01L 27/14629* (2013.01)

(58) Field of Classification Search
CPC . G02B 6/4206; G02B 17/08; H01L 27/14629
See application file for complete search history.

(56) References Cited

U.S. PATENT DOCUMENTS

| | | | | |
|---|---|---|---|---|
| 6,635,861 B1 * | 10/2003 | Stone | ................... | G02B 6/4206 250/208.1 |
| 6,975,387 B2 * | 12/2005 | Mizuno | ............. | G01M 11/0264 355/53 |
| 7,015,454 B2 * | 3/2006 | Stone | ................... | G02B 6/4206 250/208.1 |
| 7,136,159 B2 * | 11/2006 | Tsai | ................... | G01N 21/8806 356/237.5 |
| 7,446,298 B1 * | 11/2008 | Stone | ................... | G02B 6/4206 250/216 |

* cited by examiner

*Primary Examiner* — Seung C Sohn
(74) *Attorney, Agent, or Firm* — Burns & Levinson LLP; Orlando Lopez

(57) ABSTRACT

The present disclosure provides an optical imager and a method for imaging electromagnetic radiation. In one aspect, the optical imager includes an object array substantially located at an object plane, a first catadioptric element configured to substantially collimate, at a central plane, electromagnetic radiation emanating from the object array, a second catadioptric element configured to image the substantially collimated electromagnetic radiation from the central plane onto an image plane, and a detecting element substantially located at the image plane. The first catadioptric element includes at least one refractive surface and at least one reflective surface, and the second catadioptric element includes at least one refractive surface and at least one reflective surface.

20 Claims, 5 Drawing Sheets

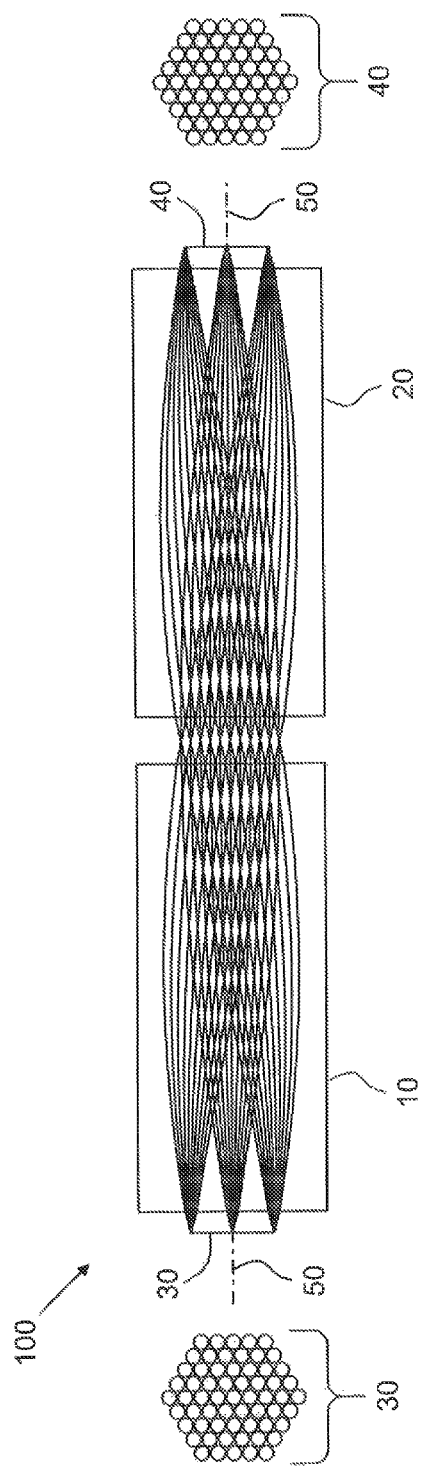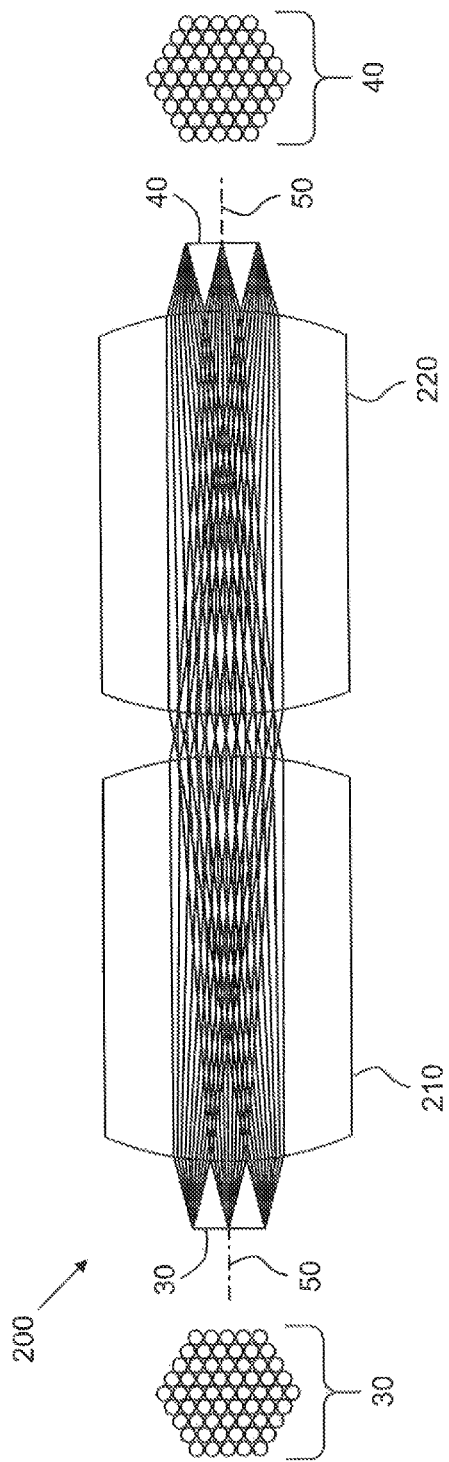

COMPACT ANNULAR FIELD IMAGER AND METHOD FOR IMAGING ELECTROMAGNETIC RADIATION

CROSS-REFERENCE TO RELATED APPLICATIONS

This application claims priority to U.S. Provisional Application No. 61/783,507, filed on Mar. 14, 2013, which is incorporated by reference herein in its entirety and for all purposes.

STATEMENT REGARDING FEDERALLY SPONSORED RESEARCH OR DEVELOPMENT

This invention was made with U.S. Government support from the U.S. Army under contract W31P4Q-09-D-0004. The U.S. Government has certain rights in the invention.

BACKGROUND

The present disclosure relates generally to an imaging relay lens system and a method for imaging electromagnetic radiation. More particularly, the present disclosure relates to an imaging relay lens system having a compact configuration and a method for imaging electromagnetic radiation.

The term "object array" can refer to any number of devices, such as but not limited to a fiber array, VCSEL array, detector array, or other object plane, and is hereinafter referred to generally as the object array. The term "image array" can refer to any number of sources, such as but not limited to a fiber array, VCSEL array, detector array, or other image plane, and is hereinafter referred to generally as the image array.

Reference is made to FIG. 1A, which illustrates an imaging relay lens 100 made up of a pair of gradient index (GRIN) lenses 10 and 20 used to image or reimage (hereinafter referred to generally as "image") an object array 30 to an image array 40. Reference is also made to FIG. 1B, which illustrates an imaging relay lens 200 comprising a pair of aspheric lenses 210 and 220 used to image an object array 30 to an image array 40. See, for example, U.S. Pat. Nos. 6,635,861, 7,015,454, and 7,446,298, which are incorporated herein by reference in their entirety and for all purposes.

The distance between object array 30 and image array 40 in these designs can be significantly long compared to the size of the array. While such distances may be acceptable for fiber coupling connectors and other similar devices, they are typically too long for other applications, such as but not limited to the board-to-board optical communication applications, which have much shorter separations. A view of an object array 30 and image array 40 for these configurations, taken along a plane perpendicular to optical axis 50, are shown next to their respective arrays in FIG. 1A and FIG. 1B.

Accordingly, there is a need to develop a new imaging relay lens system with a compact configuration.

SUMMARY

Characteristics of the present disclosure are to provide an imaging lens design that is compact in physical size.

Further characteristics of the present disclosure are to provide an imaging lens design that has a high image quality.

Further characteristics of the present disclosure are to provide an Imaging lens design that has a high degree of alignment tolerance.

Further characteristics of the present disclosure are to provide an imaging lens design that has a combination of the characteristics described above with superior trade-offs than have been previously attainable.

In accordance with an aspect, the present disclosure provides an optical imager comprising an object array substantially located at an object plane, a first catadioptric element configured to substantially collimate, at a central plane, electromagnetic radiation emanating from the object array, wherein the first catadioptric element comprises at least one refractive surface and at least one reflective surface, a second catadioptric element configured to image the substantially collimated electromagnetic radiation from the central plane onto an image plane, wherein the second catadioptric element comprises at least one refractive surface and at least one reflective surface, and a detecting element substantially located at the image plane.

In one embodiment, the first catadioptric element comprises a concave surface and a convex surface opposing the concave surface. In one embodiment, the concave surface comprises a first refractive surface and a second reflective surface, and the first refractive surface of the concave surface has a ring shape surrounding the second reflective surface of the concave surface. In one embodiment, the convex surface comprises a first reflective surface and a second refractive surface, and the first reflective surface of the convex surface has a ring shape surrounding the second refractive surface of the convex surface.

In one embodiment, the object array comprises a plurality of light emanating elements arranged in an annular region of the object array, the light emanating elements emanating the electromagnetic radiation. The at least one refractive surface of the first catadioptric element is aligned with the light emanating elements to receive the electromagnetic radiation. In one embodiment, the light emanating elements are arranged to constitute one or more concentric rings, and the light emanating elements in one of the concentric rings are located to have a substantially equal distance from an optical axis of the optical imager. In one embodiment, the first catadioptric element is oriented substantially symmetric to the second catadioptric element about a central plane.

In accordance with an aspect, the present disclosure provides a method for imaging electromagnetic radiation. The method comprises substantially collimating, through a first catadioptric element, electromagnetic radiation emanating from at least one source element located substantially at an object plane, the first catadioptric element comprising at least one refractive surface and at least one reflective surface; imaging, through a second catadioptric element, the substantially collimated electromagnetic radiation onto at least one detecting element located substantially at an image plane, the second catadioptric element comprising at least one refractive surface and at least one reflective surface; and detecting the electromagnetic radiation For a better understanding of the present disclosure, together with other and further characteristics thereof, reference is made to the accompanying drawings and detailed description.

BRIEF DESCRIPTION OF THE DRAWINGS

FIGS. 1A and 1B illustrate schematic views of conventional imaging relay lenses, taken along their respective optical axes;

DETAILED DESCRIPTION

Figure 2:
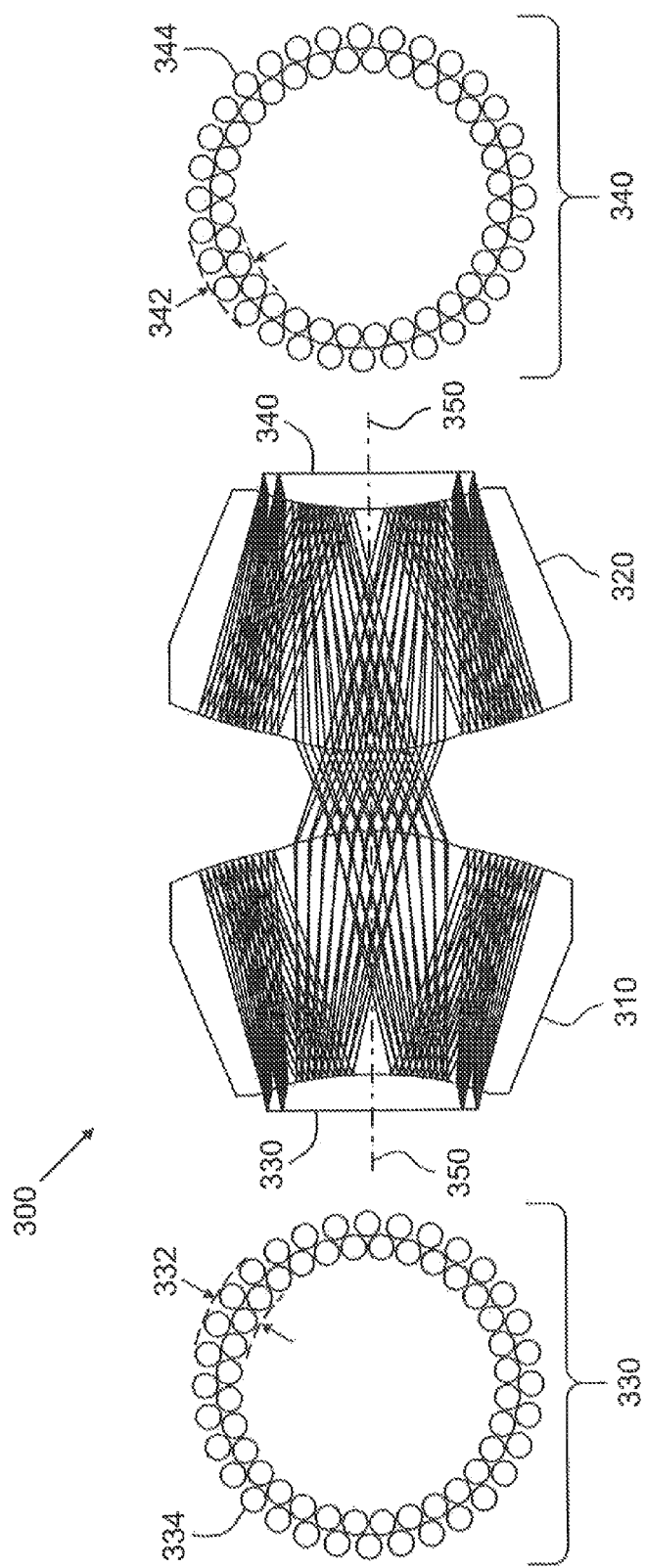
FIG. 2 illustrates a scaled schematic view of a compact imaging relay lens with high image quality, taken along its optical axis, in accordance with an embodiment of the present disclosure.

Referring to FIG. 2, there is illustrated a schematic view of a compact imaging relay lens 300, taken along its optical axis 350, in accordance with an embodiment of the present disclosure. In one embodiment, compact imaging relay lens 300 includes a pair of half relay lenses 310 and 320, each comprising a catadioptric element, to image an object array 330 to an image array 340. In some embodiments, image array 340 can be a CCD array, phosphorescent screen, photographic film, microbolometer array, or other means of detecting light energy.

Many optical imaging aberrations have spatial field dependencies, such that the image quality for elements of object array 330 are often imaged with varying aberrations, making it difficult to image object array 330 with large numbers of elements. FIG. 2 also illustrates a view of annular field object array 330 and image array 340, taken along a plane perpendicular to optical axis 350, next to their respective relay lenses 310 and 320. Although two relay lenses 310 and 320 are shown and described in the present disclosure, it is appreciated that compact imaging relay lens 300 may be configured to include a single relay lens.

By restricting object array 330 substantially to an annular field 332, where a plurality of elements 334 of object array 330 are substantially located to have a substantially equal distance from optical axis 350, elements 334 of object array 330 can be imaged by the pair of half relay lenses 310 and 320 with substantially the same aberration content. FIG. 2 shows an exemplary arrangement of elements 334, which includes two concentric rings of circular elements 334. Therefore, half relay lens 310 can be better corrected over annular field 332 than the conventional approaches where the aberration correction is typically required over the entire spatial field from optical axis 350 to the element with the furthest distance from optical axis 350. This reduced aberration content can also provide increased image quality over conventional imaging relay lens designs. In some embodiments, elements 334 of object array 330 may be apertures of an opaque substrate, thereby allowing electromagnetic radiation or light to pass therethrough, or point light sources, such as light emitting diodes (LED), quantum dots, and the like.

Because object array 330 is restricted to substantially to an annular field 332, in this embodiment, image array 340 is also substantially restricted to an annular field 342, where a plurality of detecting elements 344 of image array 340 are substantially located to have a substantially equal distance from optical axis 350. FIG. 2 shows an exemplary arrangement of detecting elements 344, which includes two concentric rings of photodetectors 344.

Figure 3:
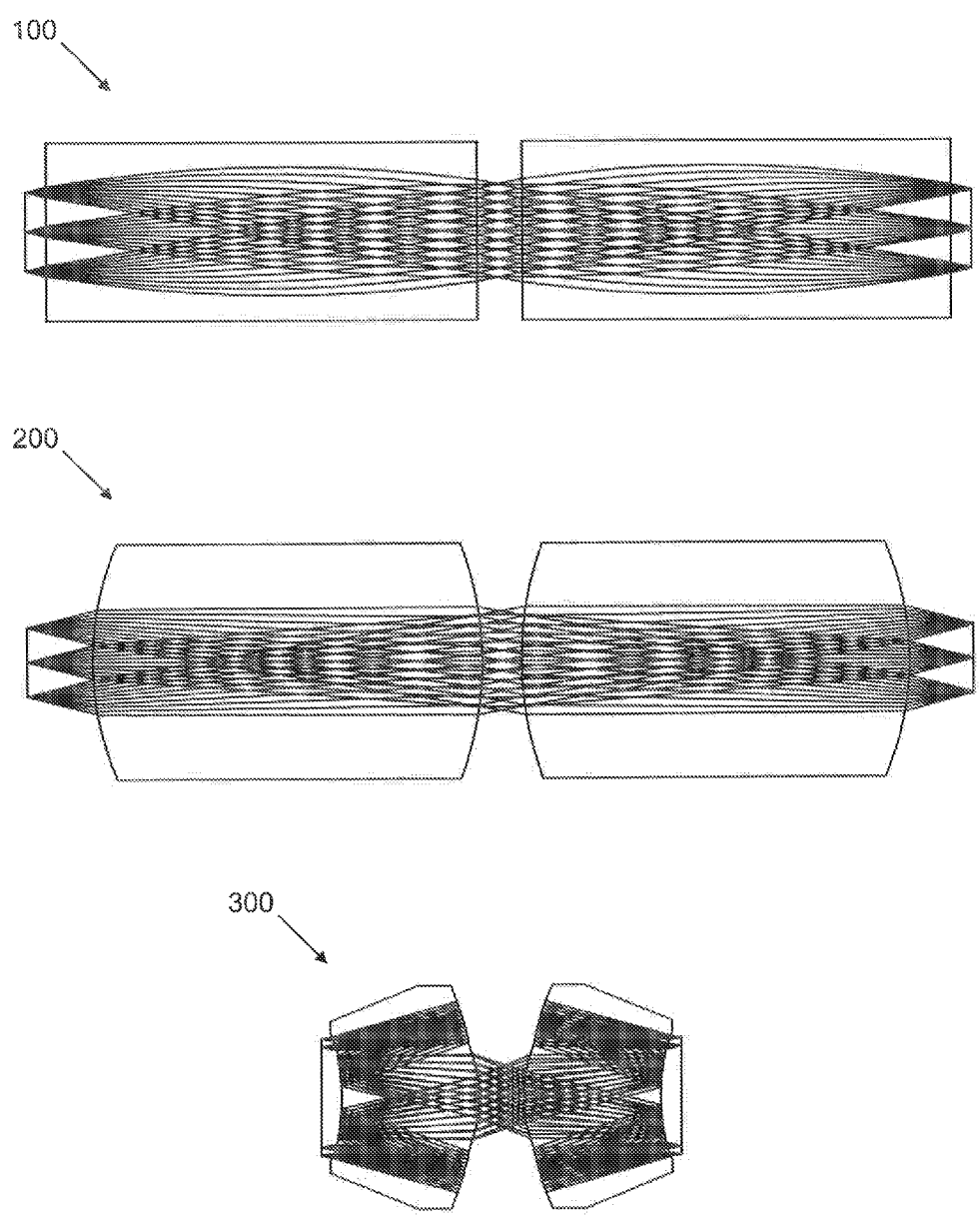
FIG. 3 illustrates a schematic comparison of the imaging relay lenses shown in FIGS. 1A and 1B, and the compact imaging relay lens shown in FIG. 2.

FIG. 3 illustrates a scaled schematic comparison of the imaging relay lenses 100 and 200 shown in FIGS. 1A and 1B, and the compact imaging relay lens 300 shown in FIG. 2. As shown in FIG. 3, the size of compact relay lens 300 is much smaller than that of imaging relay lenses 100 and 200. Particularly, the linear distance between object array 330 and image array 340 of imaging relay lens 300 is much shorter than the linear distance between object array 30 and image array 40 of imaging relay lenses 100 and 200.

Figure 4:
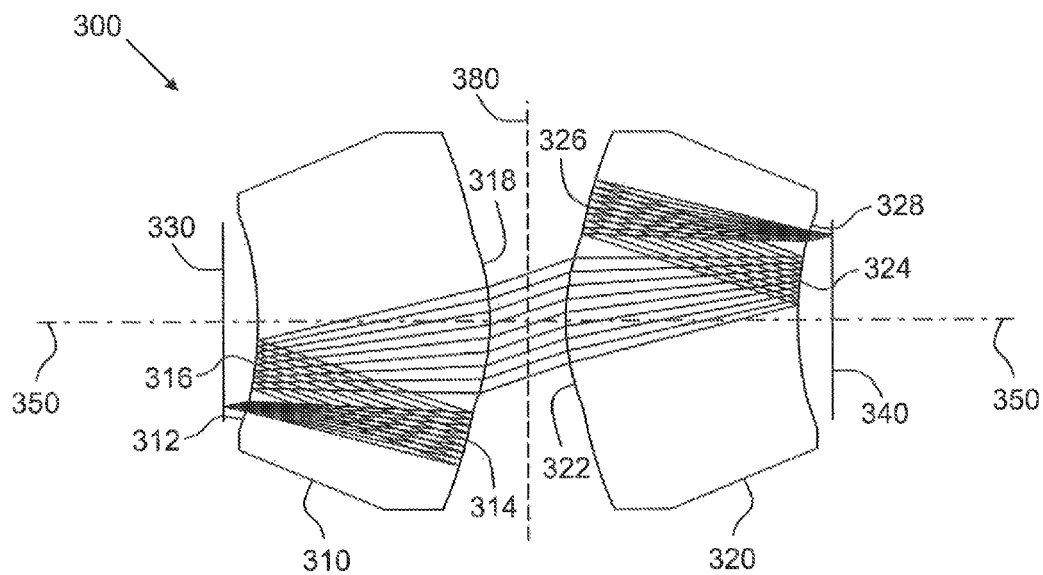
FIG. 4 illustrates a schematic view of the compact imaging relay lens of FIG. 2, including an exemplary optical ray trace.

FIG. 4 illustrates a schematic view of compact imaging relay lens 300 of FIG. 2, including an optical ray trace for a single object element 334 within annular field 332. In this embodiment, light originating from an element 334 of object array 330 is incident upon first half relay lens 310 comprising a catadioptric element.

Referring to FIG. 4, the light is refracted by a first optical surface 312, which is capable of substantially receiving the light. The light is then substantially transmitted to a first reflective surface 314, which is capable of substantially receiving the light refracted by first optical surface 312. The light is then reflected by first reflective surface 314 and transmitted to a second reflective surface 316, which is capable of substantially receiving the light reflected by first reflective surface 314. The light is then reflected by second reflective surface 316 and transmitted to a second optical surface 318, which is capable of substantially receiving the light reflected by second reflective surface 316. The light is then refracted by second optical surface 318 and transmitted towards a second half relay lens 320, which is oriented in a manner substantially symmetric to first half relay lens 310 about a central plane 380 separating the two lenses 310 and 320.

Referring still to FIG. 4, the light is further incident upon second half relay lens 320 comprising a catadioptric element. The light is refracted by a first optical surface 322, which is capable of substantially receiving the light, and substantially transmitted to a first reflective surface 324, which is capable of substantially receiving the light refracted by first optical surface 322. The light is then reflected by first reflective surface 324 and transmitted to a second reflective surface 326, which is capable of substantially receiving the light reflected by first reflective surface 324. The light is then reflected by second reflective surface 326 and transmitted to a second optical surface 328, which is capable of substantially receiving the light reflected by second reflective surface 326, where the light is refracted and imaged to image array 340. It is appreciated that, in practice, the half relay lenses 310 and 320 can include any combination of refractive, reflective, or catadioptric elements.

Figure 5:
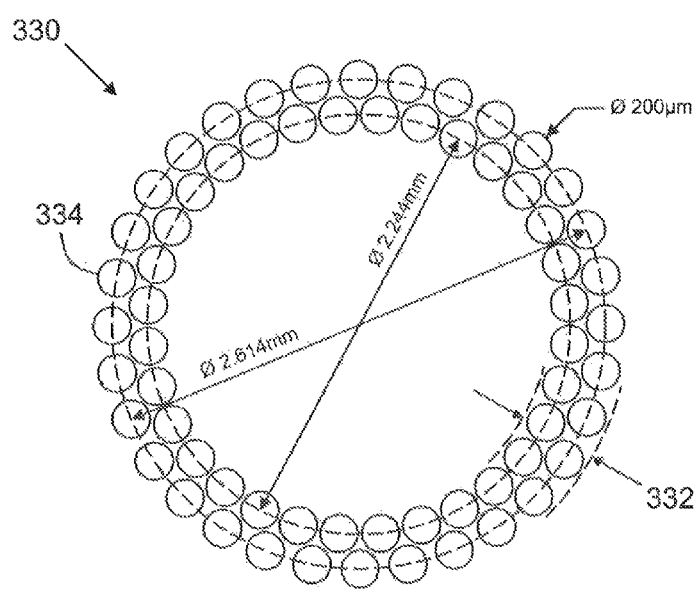
FIG. 5 illustrates a schematic view of an object array of the compact imaging relay lens shown in FIG. 2, taken along a plane perpendicular to an optical axis, in accordance with an embodiment of the present disclosure.

FIG. 5 illustrates a schematic view of an object array 330 of compact imaging relay lens 300 shown in FIG. 2, taken along a plane perpendicular to optical axis 350, in accordance with an embodiment of the present disclosure. As shown in FIG. 5, annular field 332 of elements 334 in object array 330 includes two concentric rings of circular elements 334. It is appreciated that, in practice, these arrays can include any number of rings or annular configuration of elements with various shapes and sizes.

Figure 6:
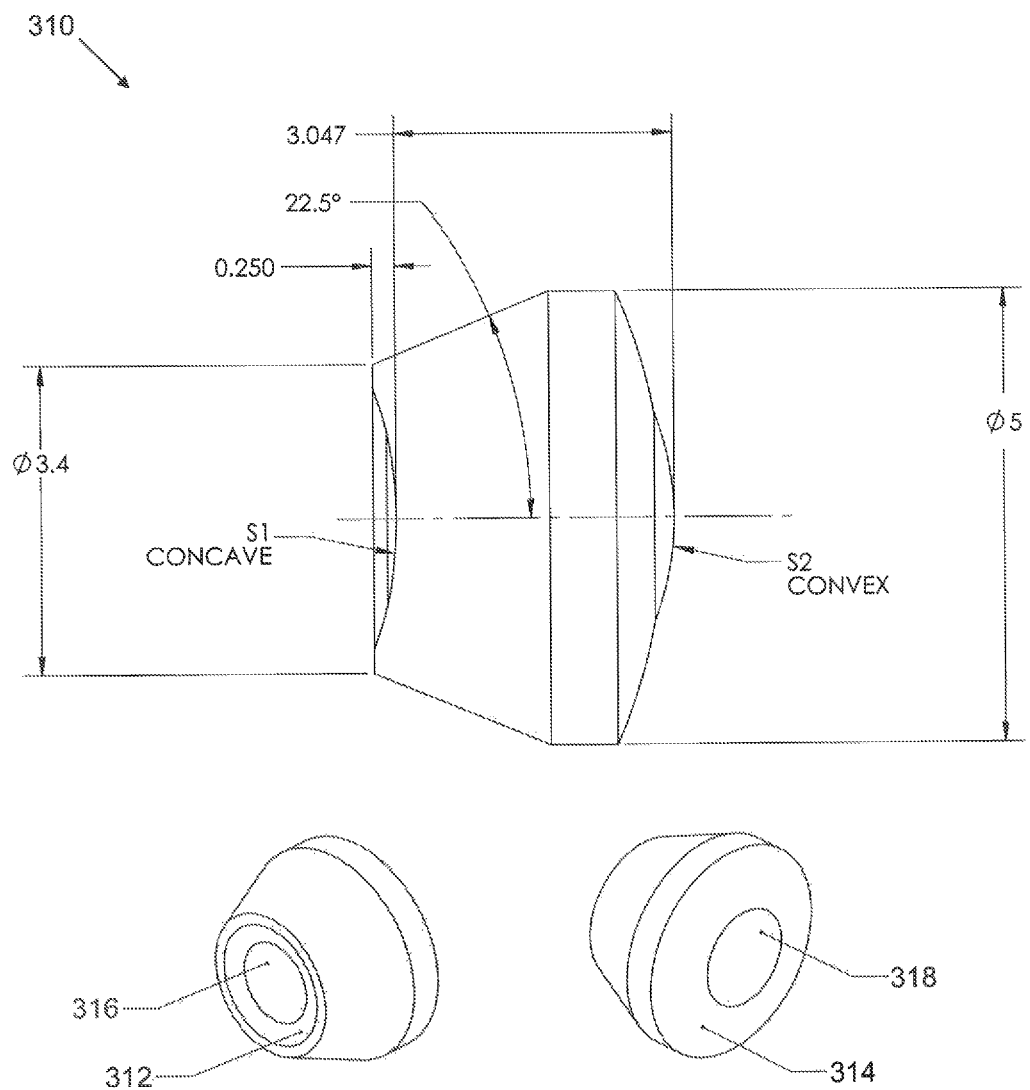
FIG. 6 illustrates lateral and isometric views of a half relay lens component of the compact imaging relay lens as shown FIG. 2, in accordance with an embodiment of the present disclosure.

FIG. 6 illustrates lateral and isometric views of half relay lens component 310 of compact imaging relay lens 300 as shown FIG. 2, in accordance with an embodiment of the present disclosure. As shown in FIG. 6, half relay lens component 310 includes reflective and refractive surfaces 312, 314, 316, and 318. In this embodiment, a concave surface S1 includes first refractive surface 312 and second reflective surface 316, while a convex surface S2 includes first reflective surface 314 and second refractive surface 318. In some embodiments, first and second reflective surfaces 314 and 316 may be formed by coating one or more layers of reflective material (e.g., metal layer or dielectric multilayers) on half relay lens component 310.

The compact annular field imager of the present invention has been hereto shown as operating in pairs as an optical relay lens, which inherently provides natural correction of odd-order aberration within the optical system. However, these annular field imagers can also be used independently as infinite conjugate annular field imagers to image an annular field of object points in a given scene onto an image array.

As used herein, the singular forms "a," "an," and "the" include the plural reference unless the context clearly dictates otherwise. Except where otherwise indicated, all numbers expressing quantities of ingredients, reaction conditions, and so forth used in the specification and claims are to be understood as being modified in all instances by the term "about."

For the purpose of better describing and defining the present invention, it is noted that terms of degree (e.g., "substantially," "about," and the like) may be used in the specification and/or in the claims. Such terms of degree are utilized herein to represent the inherent degree of uncertainty that may be attributed to any quantitative comparison, value, measurement, and/or other representation. The terms of degree may also be utilized herein to represent the degree by which a quantitative representation may vary (e.g., ±10%) from a stated reference without resulting in a change in the basic function of the subject matter at issue.

Although embodiments of the present teachings have been described in detail, it is to be understood that such embodiments are described for exemplary and illustrative purposes only. Various changes and/or modifications may be made by those skilled in the relevant art without departing from the spirit and scope of the present disclosure as defined in the appended claims.

What is claimed is:

1. An optical imager, comprising:
    a first catadioptric element configured to substantially collimate, at a central plane, electromagnetic radiation emanating from an object array, the object array being substantially located at an object plane; wherein the first catadioptric element comprises at least one refractive surface and at least one reflective surface;
    a second catadioptric element configured to image the substantially collimated electromagnetic radiation from the central plane onto an image plane, wherein the second catadioptric element comprises at least one refractive surface and at least one reflective surface; and
    an image array substantially located at the image plane.

2. The optical imager of claim 1, wherein the first catadioptric element comprises a concave surface and a convex surface opposing the concave surface.

3. The optical imager of claim 2, wherein the concave surface comprises a first refractive surface and a second reflective surface.

4. The optical imager of claim 3, wherein the first refractive surface of the concave surface has a ring shape surrounding the second reflective surface of the concave surface.

5. The optical imager of claim 2, wherein the convex surface comprises a first reflective surface and a second refractive surface.

6. The optical imager of claim 5, wherein the first reflective surface of the convex surface has a ring shape surrounding the second refractive surface of the convex surface.

7. The optical imager of claim 1, wherein the object array comprises a plurality of light emanating elements arranged in an annular region of the object array, said light emanating elements emanating the electromagnetic radiation.

8. The optical imager of claim 7, wherein said at least one refractive surface of the first catadioptric element is aligned with the light emanating elements to receive the electromagnetic radiation.

9. The optical imager of claim 7, wherein the light emanating elements are arranged to constitute one or more concentric rings.

10. The optical imager of claim 9, wherein the light emanating elements in one of said one or more concentric rings are located to have a substantially equal distance from an optical axis of the optical imager.

11. The optical imager of claim 1, wherein the first catadioptric element is oriented substantially symmetric to the second catadioptric element about the central plane.

12. An imaging relay lens system, comprising:
    a first optical system comprising at least one first catadioptric optical element, the first catadioptric optical element comprising at least one refractive surface and at least one reflective surface, wherein the first optical system is configured to substantially collimate, at a central plane, electromagnetic radiation emanating from at least one object element; said at least one object element being located substantially at an object plane;
    a second optical system having at least one second catadioptric optical element, the second catadioptric optical element comprising at least one refractive surface and at least one reflective surface, wherein the second optical system is configured to image the substantially collimated electromagnetic radiation from the central plane onto an image plane; and
    at least one detector element located substantially at the image plane.

13. The lens system of claim 12, wherein the first catadioptric element comprises a concave surface and a convex surface opposing the concave surface.

14. The lens system of claim 13, wherein the concave surface comprises a first refractive surface and a second reflective surface.

15. The lens system of claim 14, wherein the first refractive surface of the concave surface has a ring shape surrounding the second reflective surface of the concave surface.

16. The lens system of claim 13, wherein the convex surface comprises a first reflective surface and a second refractive surface.

17. The lens system of claim 16, wherein the first reflective surface of the convex surface has a ring shape surrounding the second refractive surface of the convex surface.

18. The lens system of claim 12, wherein said at least one refractive surface of the first catadioptric element is aligned with said at least one object element to receive the electromagnetic radiation.

19. The lens system of claim 12, wherein the first catadioptric optical element is oriented substantially symmetric to the second catadioptric optical element about the central plane.

20. A method for imaging electromagnetic radiation, the method comprising:
    substantially collimating, through a first catadioptric element, electromagnetic radiation emanating from at least one source element located substantially at an object plane, the first catadioptric element comprising at least one refractive surface and at least one reflective surface;
    imaging, through a second catadioptric element, the substantially collimated electromagnetic radiation onto at least one detecting element located substantially at an image plane, the second catadioptric element comprising at least one refractive surface and at least one reflective surface; and
    detecting the electromagnetic radiation.

* * * * *